(12) United States Patent
Chuang et al.

(10) Patent No.: US 8,587,074 B2
(45) Date of Patent: Nov. 19, 2013

(54) DEVICE HAVING A GATE STACK

(75) Inventors: Harry-Hak-Lay Chuang, Hsinchu (TW); Ming-Hsiang Song, Shin-Chu (TW); Kuo-Ji Chen, Taipei County (TW); Ming Zhu, Singapore (SG); Po-Nien Chen, Miaoli (TW); Bao-Ru Young, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 249 days.

(21) Appl. No.: 13/101,727

(22) Filed: May 5, 2011

(65) Prior Publication Data
US 2012/0280323 A1 Nov. 8, 2012

(51) Int. Cl.
H01L 29/76 (2006.01)
H01L 29/94 (2006.01)
H01L 31/062 (2012.01)
H01L 31/113 (2006.01)
H01L 31/119 (2006.01)

(52) U.S. Cl.
USPC .................................. 257/368; 257/E27.06

(58) Field of Classification Search
None
See application file for complete search history.

Primary Examiner — Thien F Tran
(74) Attorney, Agent, or Firm — Lowe Hauptman & Ham, LLP

(57) ABSTRACT

A device includes a drain, a source, and a gate stack. The gate stack has a gate dielectric layer, a gate conductive layer immediately on top of the gate dielectric layer, and first gate and a second gate layer that are immediately on top of the gate conductive layer. The first gate layer has a first resistance higher than a second resistance of the second gate layer. The second gate layer is conductive, is electrically coupled with the gate conductive layer, and has a contact terminal configured to serve as a gate contact terminal for the device. Fabrication methods of the gate stack are also disclosed.

23 Claims, 9 Drawing Sheets

DEVICE HAVING A GATE STACK

FIELD

The present disclosure is related to a device having a gate stack and fabrication methods thereof.

BACKGROUND

Electrostatic-Discharge (ESD) protection devices are used to prevent integrated circuits (ICs) from ESD damage during manufacturing and applications. For example, when an ESD voltage is received by the IC and the ESD device, the transistors of the ESD device are turned on to sink the high current to ground, preventing the high current from flowing through the IC. The IC is therefore protected. Current ESD devices have low gate resistances, and thus lower ESD protection. As a result, in an approach, an additional resistor is coupled to the gate of the ESD device to increase the total gate resistance. Because of the additional resistor, the die area increases.

Various transistors have a gate stack, but the applications using such a gate stack is limited.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 4A-9A are cross section diagrams and FIGS. 4B-9B are top view diagrams of the ESD device in FIG. 1 going through various manufacturing steps, in accordance with some embodiments.

Like reference symbols in the various drawings indicate like elements.

DETAILED DESCRIPTION

Figure 1A:
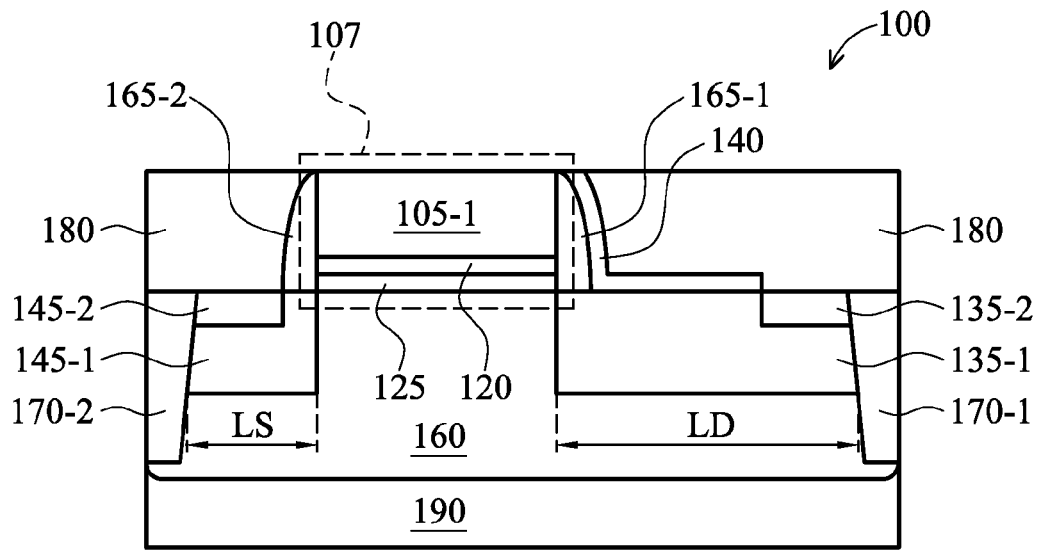
FIGS. 1A and 1B are a cross section diagram and a top view diagram of an ESD device, respectively, in accordance with a first embodiment.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. A gate stack includes a metal layer that is used as a first plate for a metal-oxide-silicon capacitor. The well serves as a second plate. An ESD device using the gate stack has an effective high gate resistance without the die area penalty and/or an additional resistor like in other approaches. The polysilicon (poly) gate layer of the gate stack provides a better ESD protection, because of its high effective resistance that limits the incoming current while the ESD device is being turned on. In various embodiments, there is no salicide on the poly gate layer for the contact terminals. Instead, the contact terminals are built in a region of the poly gate layer that has been converted to a metal region. The poly gate layer of the gate stack is doped or un-doped. The gate stack of the ESD device locates on the active region and includes a high-K layer and a metal layer.

Exemplary Device Structure

To not obscure the drawings, top views of spacers, of shallow trench isolations (STIs), and of the interlayer dielectric are not shown. Further, the cross section view of the contacts is not shown.

Figure 1B:
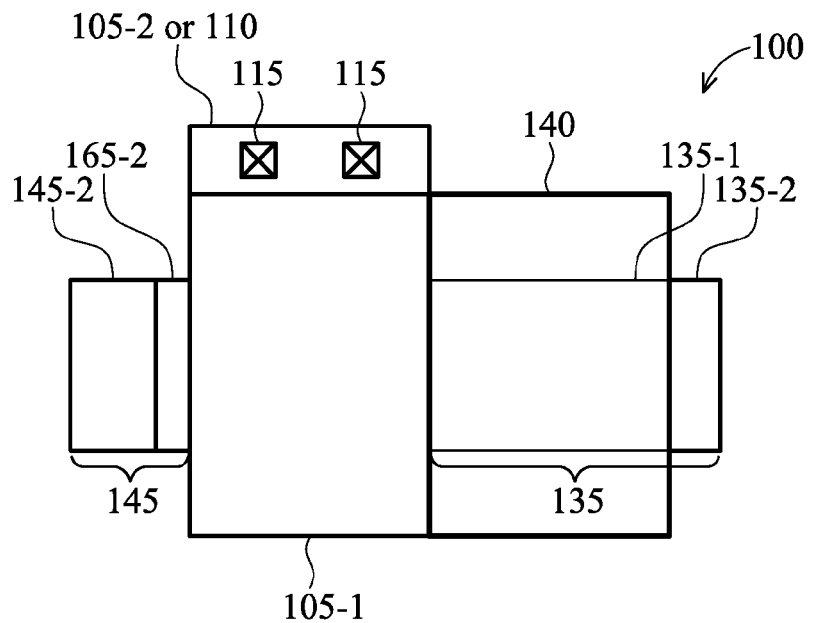
Figure 1C:
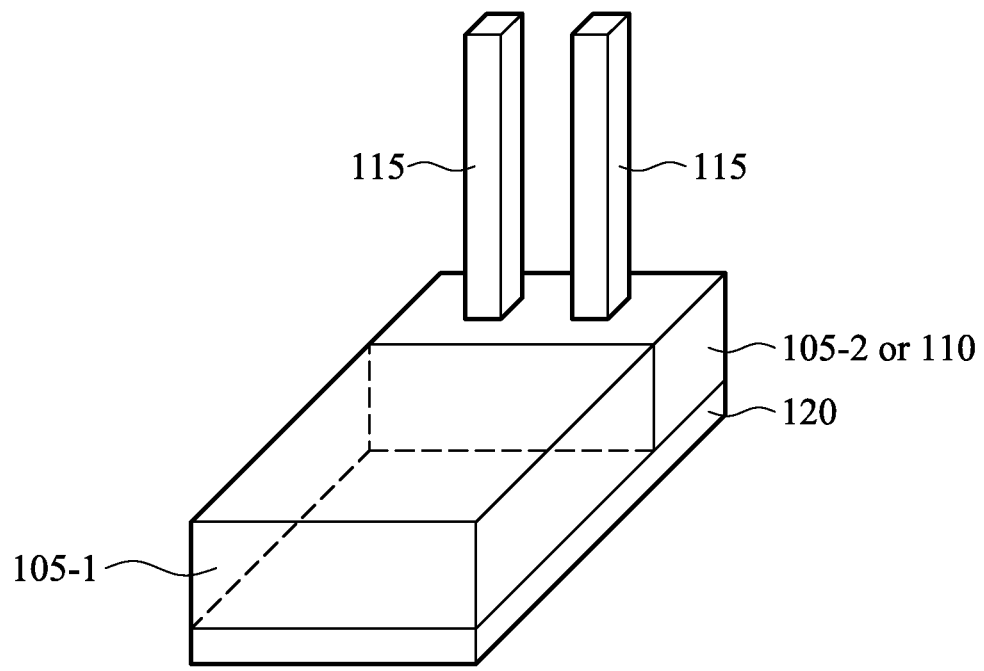
FIG. 1C is a three dimensional diagram illustrating the connections of the gate contacts, the gate contact region, the polysilicon (poly) gate layer, and the metal gate layer of the ESD device, in accordance with a first embodiment.

FIG. 1A and FIG. 1B are a cross section diagram and a top view diagram of an ESD device 100, respectively, in accordance with some embodiments. FIG. 1C is a three dimensional diagram showing the locational relationship between a poly gate layer 105-1, metal layer 105-2 or 110, contacts 115, and metal gate layer 120. In some embodiments, metal layer 110 is formed from a portion of a poly layer 105 that is illustratively shown in FIGS. 4A and 4B and that also includes poly gate layer 105-1. As a result, reference numbers 105-2 and 110 are used interchangeably.

In some embodiments, ESD device 100 is manufactured by a gate-last process. A gate stack 107 includes a poly gate layer 105-1 on top of a metal gate layer 120, which is in turn on top of a dielectric layer 125. Compared with another approach, gate stack 107 does not include a metal or an aluminum oxide layer in between metal gate layer 120 and dielectric layer 125. Further, poly layer 105 does not have a salicide region for the gate contact terminals or gate "contacts" 115. Gate contacts 115 instead are formed on metal layer 110.

In some embodiments, the effective resistance of gate stack 107 is based on the resistance Rg (not labeled) of poly gate layer 105-1 and the resistance Rm (not labeled) of metal gate layer 120. With respect to contacts 115, the resistors having respective resistance Rg and resistance Rm are coupled in parallel. Further, resistance Rg of poly gate layer 105-1 is much higher than resistance Rm of metal gate layer 120. As a result, the effective resistance of gate stack 107 depends on resistance Rm of metal gate layer 120. In some embodiments, the resistivity of resistance Rm is about 500Ω per square unit while the resistivity of resistance Rg is about 10,000Ω per square unit. Consequently, the effective resistivity of gate stack 107 is about 500Ω per square unit. As a result, the resistance of gate stack 107 is much higher than the effective gate resistance of other approaches. Consequently, ESD device 100 provides better ESD protection because the higher gate resistance limits the incoming current while ESD device 100 is being turned on when, for example, ESD device 100 receives a high ESD voltage. In some embodiments, the resistance Rm of metal gate layer 120 depends on the thickness of metal gate layer 120. Consequently, the effective resistance of gate stack 107 depends on the thickness of metal gate layer 120.

Poly gate layer 105-1 is doped or un-doped, depending on the thickness of hard mask 108 illustratively shown in FIGS. 4A and 4B, below. In some embodiments, metal gate layer 120 includes titanium nitride (TiN), and dielectric layer 125 includes silicon oxide. Other materials suitable for a metal gate layer and a dielectric layer, however, are within the scope of various embodiments. In some embodiments, metal gate layer 110 and metal gate layer 120 are electrically conductive. Further, metal gate layer 110 is directly on top of and in touch with metal gate layer 120. As a result, metal gate layer 120 receives a voltage, for example, through contacts 115 and metal gate layer 110.

In some embodiments, metal gate layer 110 initially includes poly and is part of poly layer 105. In other words, poly layer 105 initially includes poly regions 105-1 and 105-2. Poly region 105-2 is then converted to metal to form metal gate layer 110. Contact terminals or contacts 115 are manufactured in and extend beyond metal gate layer 110. As a result, metal gate layer 110 is also called the gate contact region. ESD device 100 is distinguished from the ESD device in another approach in which a salicide region is formed on the gate stack for the contacts 115 to be formed. Poly layer 105 including poly is used for illustration. Other materials suitable to replace poly such as amorphous silicon are within the scope of various embodiments.

In some embodiments, metal layer 120, dielectric layer 125, and N-well 160 form a metal-oxide-silicon capacitor (MOS capacitor or MOSCAP). With respect to the MOSCAP, metal layer 120 includes metal and serves as a first plate. N-well 160 includes silicon and serves as a second plate while layer 125 includes silicon oxide and serves as the capacitance dielectric.

Drain 135 includes a non-salicide region 135-1, and a salicide region 135-2. Source 145 includes a non-salicide region 145-1 and a salicide region 145-2. Drain salicide region 135-2 and source salicide region 145-2 are also called the drain contact region and the source contact region because they are to form the contacts for the drain 135 and the source 145, respectively. In some embodiments, the resistance of drain salicide region 135-2 is much lower than the resistance of drain non-salicide region 135-1. As a result, the effective resistance of drain 135 is lower than the resistance of drain 135 in which all drain contact region 135-2 is non-salicided. Similarly, the resistance of source salicide region 145-2 is much lower than the resistance of source non-salicide region 145-1. As a result, the effective resistance of source 145 is lower than the resistance of source 145 in which all source contact region 145-2 is non-salicided. Consequently, the current flowing through drain 135 and/or source 145 is higher. Drain salicide region 135-2 and source salicide region 145-2 also act as an etch stop layer. ESD device 100 is called asymmetric because a length LD of drain 135 and a length LS of source 145 have different sizes and are therefore asymmetrical with respect to gate stack 107. Those of ordinary skill in the art will recognize that when drain 145 and source 135 are symmetrical with respect to gate stack 107, length LD and length LS have the same sizes, and the corresponding device is called a symmetric device.

Resistor protection oxide (RPO) layer 140 covers the drain non-salicide region 135-1 and spacer 165-1 to protect drain 135 from being salicided where unwanted, for example, during the steps of manufacturing ESD device 100. In FIG. 1, RPO layer 140 protects drain non-salicide region 135-1 from being salicided. In various situations, RPO layer 140 enables ESD device 100 to have a stable ESD protection by increasing the series resistance of an output buffer coupled to drain 135. For example, the effective resistance in series with drain 145 can be used to clamp the current between the source and the drain to prevent the current from flowing to the low resistance areas. The current is also uniformly distributed along the drain-substrate junction due to the high drain side resistance in series.

Spacer 165-1 is on top of a portion of drain non-salicide region 135-1, having one side along gate stack 107. Spacer 165-2 is on top of a portion of source non-salicide region 145-1, having one side along gate stack 107. Spacer 165-2 is built to prevent source salicide region 145-2 from being too close to gate stack 107.

Shallow trench isolations (STIs) 170-1 and 170-2 prevent current leakage between different elements of ESD 100 and of other devices not shown.

Interlayer dielectric layer (ILD) 180 separates different layers sandwiching ILD 180. In some embodiments, ILD 180 includes silicon oxide.

In some embodiments, ESD device 100 is a P-type field effect transistor (PFET). As a result, well 160 is an N-well. If, however, ESD device 100 is an NFET, well 160 would be a P-well. If ESD device 100 is of N-type, drain 145 and source 135 are of N-type while well 160 is of P-type. As a result, a transistor, e.g., transistor T (not labeled), is formed by gate stack 107, drain 145 and source 135 that includes the N-P-N junctions between drain 145, well 160, and source 135. In contrast, if ESD device 100 is of P-type, drain 145 and source 135 are of P-type while well 160 is of N-type. As a result, transistor T includes the P-N-P junctions between drain 145, well 160, and source 135. In various embodiments, ESD device 100 is configured such that drain 145 receives the ESD voltage when the ESD event occurs. For example, drain 145 is coupled to an IO pad of an integrated circuit (IC) under protection. When ESD device 100 receives the ESD voltage, transistor T is turned on to sink the high current to ground, preventing the high current flowing through the IC. The IC is therefore protected. Various embodiments are advantageous over other approaches, because gate stack 107 has a high effective resistance and thus provides a better ESD protection.

ESD device 100 is formed in a substrate or bulk 190.

Figure 2:
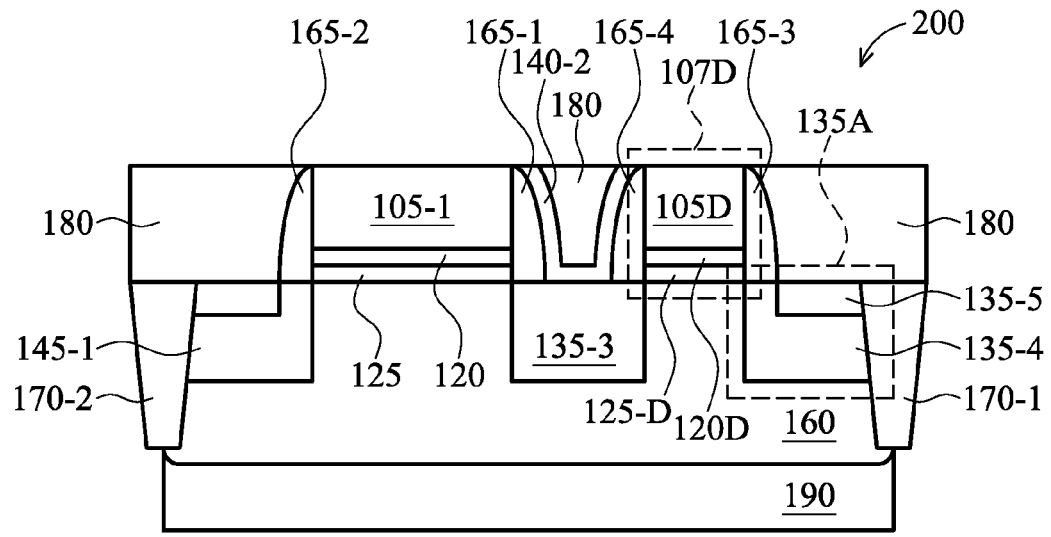
FIG. 2 is a cross section diagram of an ESD device, in accordance with a second embodiment.

FIG. 2 is a cross section diagram of an ESD device 200, in accordance with some embodiments.

Compared with ESD device 100, ESD device 200 additionally includes a "dummy" gate stack 107D. Gate stack 107D in turn includes a dummy poly gate layer 105D, a dummy metal gate layer 120D, and a dummy gate dielectric layer 125D, which correspond to poly gate layer 105, metal gate layer 120, and gate dielectric layer 125 of ESD device 100, respectively.

Drain 135A that includes a drain non-salicide region 135-4 and drain salicide region 135-5 corresponds to drain 135 of ESD device 100. Drain non-salicide region 135-4 and drain salicide region 135-5 of ESD device 200 correspond to drain non-salicide region 135-1 and drain salicide region 135-2 of ESD device 100, respectively. Drain non-salicide region 135-4, however, is smaller than drain non-salicide region 135-1. For example, drain non-salicide region 135-1 extends from STI 170-1 to an edge of gate stack 107, but drain non-salicide region 135-4 extends from STI 170-1 to an edge of gate stack 107D.

A drain or a drain non-salicide region 135-3 is additionally included in ESD device 200, and extends from one edge of gate stack 107 to one edge of gate stack 107D.

Spacers 165-3 and 165-4 with respect to gate stack 107D correspond to spacers 165-1 and 165-2 with respect to gate stack 107.

RPO layer 140-2 of ESD device 200 corresponds to RPO layer 140 of ESD device 100. RPO-140-2, however, covers spacer 165-1, a portion of drain non-salicide region 135-3, and spacer 165-4 to protect drain non-salicide region 135-3 from being salicided.

ESD device 200 has advantages because dummy gate stack 107D is built by a high resolution technique. As a result, the location of the edge of gate stack 107 on the surface of substrate 190 is accurately determined. Further, the width of spacer 165-3 extending from one edge of gate stack 107 to one edge of drain salicide region 135-5 is known. Consequently, the edge of drain salicide region 135-5 near spacer 165-3 is accurately determined.

Figure 3:
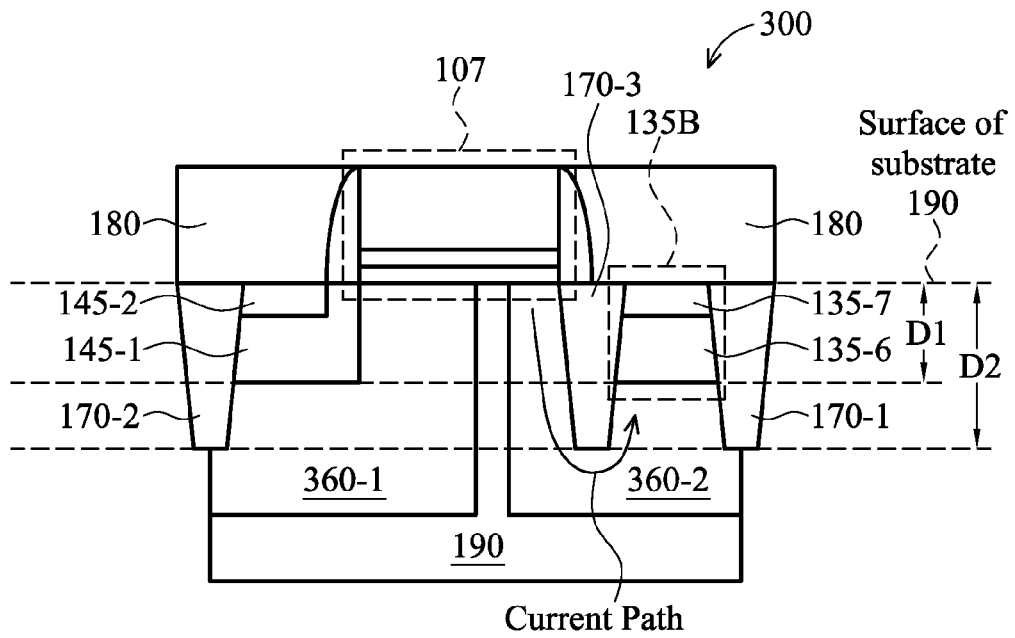
FIG. 3 is a cross section diagram of an ESD device, in accordance with a third embodiment.

FIG. 3 is a diagram of an ESD device 300, in accordance with some embodiments.

Compared with ESD device 100, ESD device 300 additionally includes an STI 170-3, which extends from one edge of gate stack 107 to one edge of drain 135B that includes a drain non-salicide region 135-6 and drain salicide region 135-7. Drain non-salicide region 135-6 and drain salicide region 135-7 of ESD device 300 correspond to drain non salicide region 135-1 and drain salicide region 135-2 of ESD device 100, respectively. In effect, drain 135B of ESD device 300 is in between STI 170-3 and STI 170-1. Depth D1 of drain 135B from the surface of substrate 190 to the bottom of drain 135B is shorter than depth D2 of STI 170-3 from the surface of substrate 190 to the bottom of STI 170-3. As a result, a current flowing from gate stack 107 of ESD device 300 to drain 135B of ESD device 300 travels around STI 170-3 as shown as "current path," which travels a longer distance than a current flowing from gate stack 107 to drain 135 of ESD device 100. Consequently, drain 135B of ESD device 300 is considered to have a resistance higher than the resistance of drain 135 of ESD device 100. In various situations, the drain resistance is used to clamp the current and prevents the current from flowing to the low resistance areas. Because there is no salicide under RPO layer 140, the current is uniformly distributed between the drain and substrate junction.

ESD device 300 does not include an RPO layer like RPO layer 140 of ESD device 100 because non-salicide region 135-6 is covered by drain salicide region 135-7 and STI 170-3, which serve as the protection layers that prevent non-salicide region 135-6 from being salicided.

Well 360-1 that contains source 145 is of a dopant type different the dopant type of source 145 and drain 135B. In contrast, well 360-2 that contains drain 135B and STI 170-3 is of the same dopant type as the dopant type of source 145 and drain 135B. For example, if ESD device 300 is a PFET, well 360-1 is of N-type while well 360-2 is of P-type. In contrast, if ESD device 300 is an NFET, well 360-1 is of P-type while well 360-2 is of N-type. In various embodiments, a single well is used for both source 145 and drain 135B, instead of two wells 360-1 and 360-2 as illustratively shown in FIG. 3.

FIGS. 4A through 9A are cross-section diagrams and FIGS. 4B through 9B are top-view diagrams of ESD device 100 going through various manufacturing steps, in accordance with some embodiments. FIGS. 4A through FIG. 9A and FIG. 4B through 9B represent structures 400 through 900, respectively.

Figure 4A:
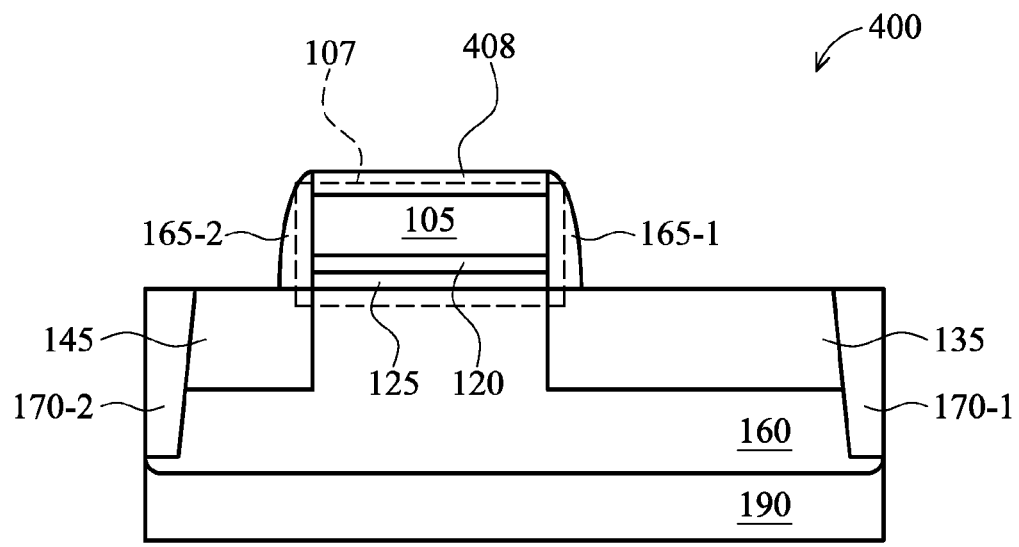
Figure 4B:
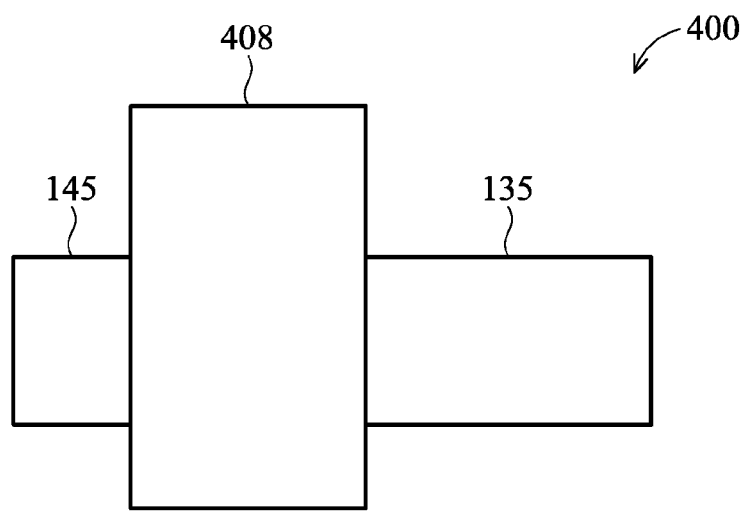

In structure 400 of FIGS. 4A and 4B, drain 135, source 145, gate stack 107, hard mask 408, spacers 165-1 and 165-2, and STO 170-1 and 170-2 have been formed. Drain 135 and source 145 are formed in well 160, which is formed in substrate 190. Forming structure 400 is done by various ways.

Hard mask layer 408 is on top of poly gate layer 105. In some embodiments, hard mask 408 includes silicon oxide. Poly gate layer 105 is doped or undoped depending on the thickness of hard mask 408. For example, during implantation of drain 135 and source 145, if hard mask 408 is thick, hard mask 408 protects poly gate layer 105 from implantation materials. As a result, poly gate 105 is undoped. But if hard mask 408 is thin, poly gate 105 is doped because implantation materials pass through hard mask 408 to poly gate layer 105. After structure 400 is completed, the source/drain implantation of ESD device 100 is completed.

Figure 5A:
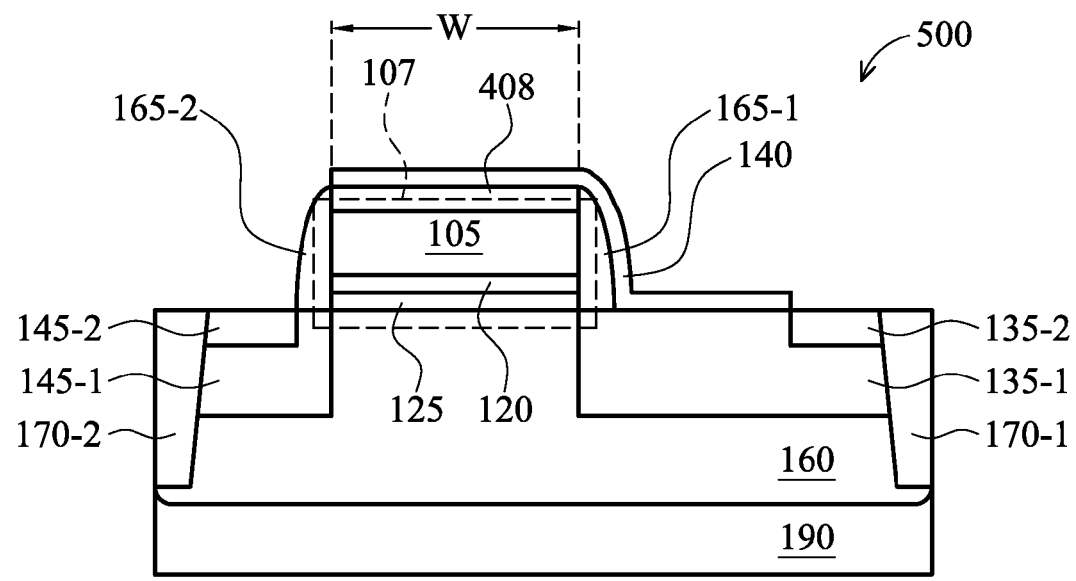
Figure 5B:
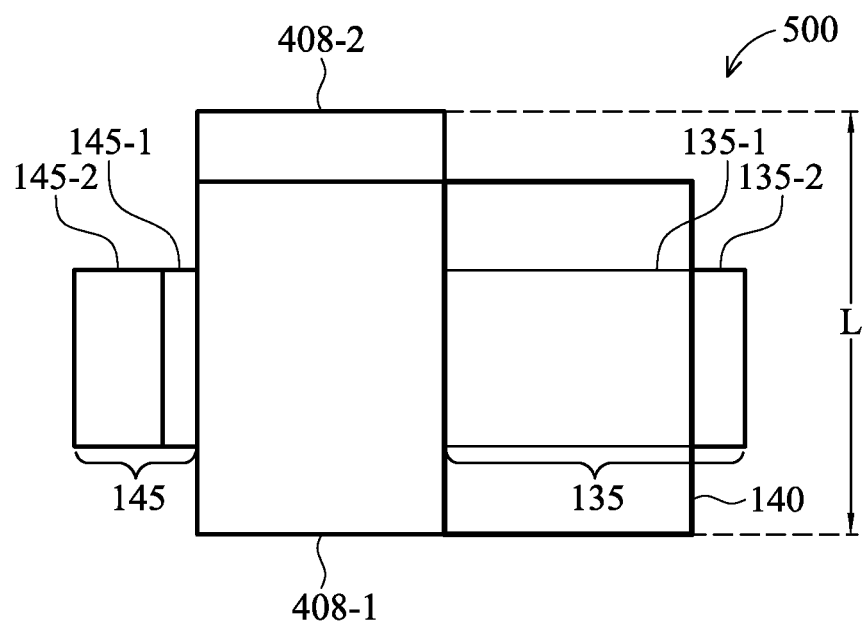

In structure 500 of FIGS. 5A and 5B, RPO layer 140 is deposited and patterned to cover a portion of drain 135, spacer 165-1, and a portion of hard mask 408 in the length L direction. Hard mask 408 thus now includes an uncovered portion 408-1 and a covered portion 408-2. Hard mask portion 408-1 and 408-2 correspond to the poly portion 105-1 and 105-2, respectively. RPO layer 140 protects the covered areas while salicide is formed in a portion of each of drain 135 and source 145. In some embodiments, RPO layer 140 includes silicon dioxide, and a lithography process is used to pattern RPO layer 140 after RPO layer 140 is deposited. FIG. 5 showing RPO layer 140 covering the whole width W of hard mask 408 is for illustration. In various embodiments, RPO layer 140 covers a portion in the width W direction of hard mask 408 or does not cover any portion of hard mask 408, as long as non-salicide regions 135-1 and 145-1 of drain 135 and source 145 are protected from being salicided. For example, RPO layer 140 only covers spacer 165-1 and a drain portion 135-1 in some embodiments.

The salicide portions 135-2 and 145-2 of respective drain 135 and source 145 are then formed. As a result, drain 135 includes a non-salicide portion 135-1 and a salicide portion 135-2. Similarly, source 145 includes a non-salicide portion 145-1 and a salicide portion 145-2. Drain salicide region 135-2 and source salicide region 145-2 are used to form contacts for drain 135 and source 145, respectively. In some embodiments, salicide regions 135-2 and 145-2 are formed by having nickel deposited then annealed on the portions of drain 135 and source 145 to be salicided. Drain salicide region 135-2 and source salicide region 145-2 are also called the drain contact region and the source contact region, respectively.

Figure 6A:
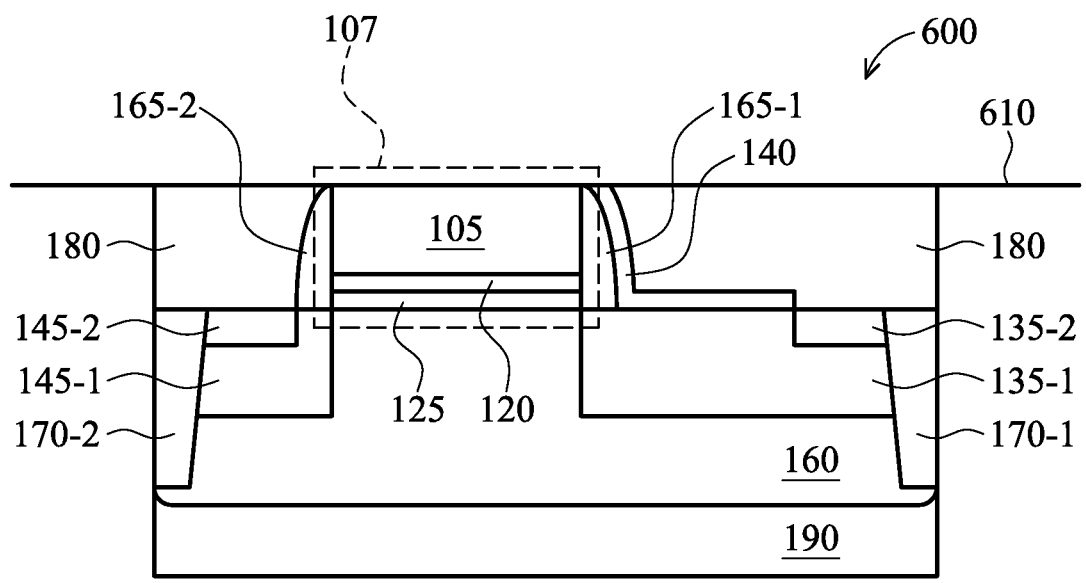
Figure 6B:
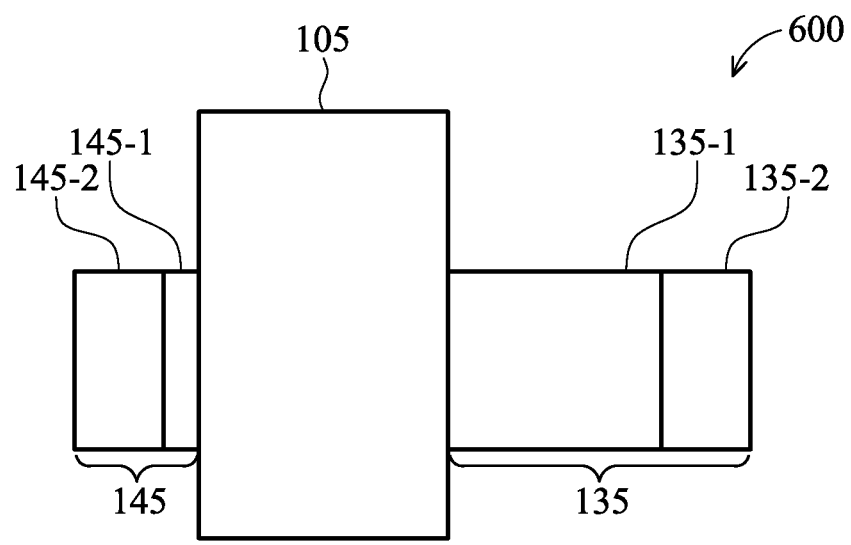

In structure 600 of FIGS. 6A and 6B, hard mask 408 and RPO layer 140 are removed. In some embodiments, the removal is by a photoresist (PR) and etch back procedure. Interlayer dielectric 180 is then deposited, and surface 610 is polished by a Chemical and Mechanical Polish (CMP) process.

Figure 7A:
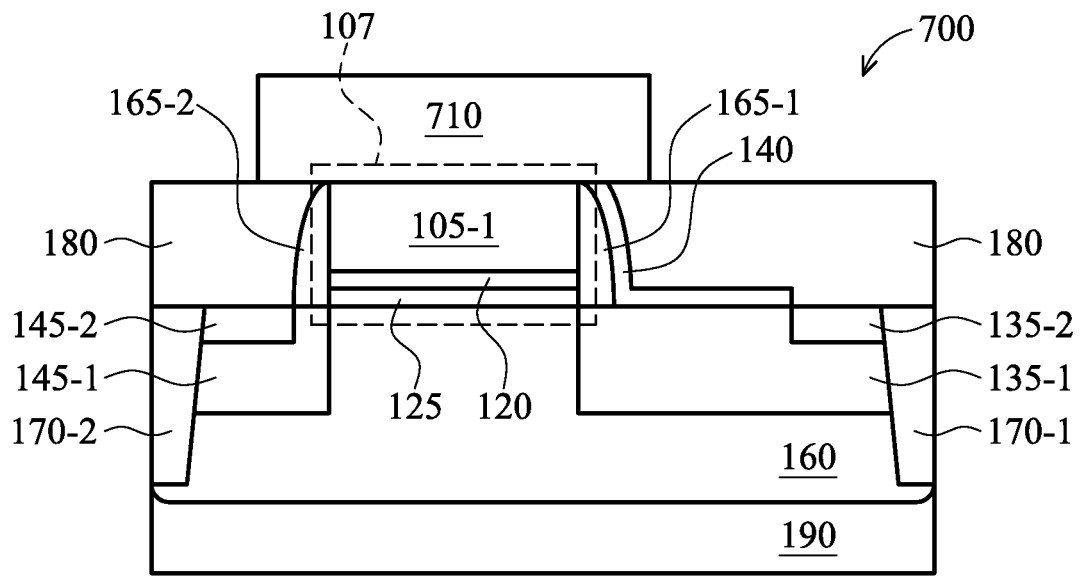
Figure 7B:
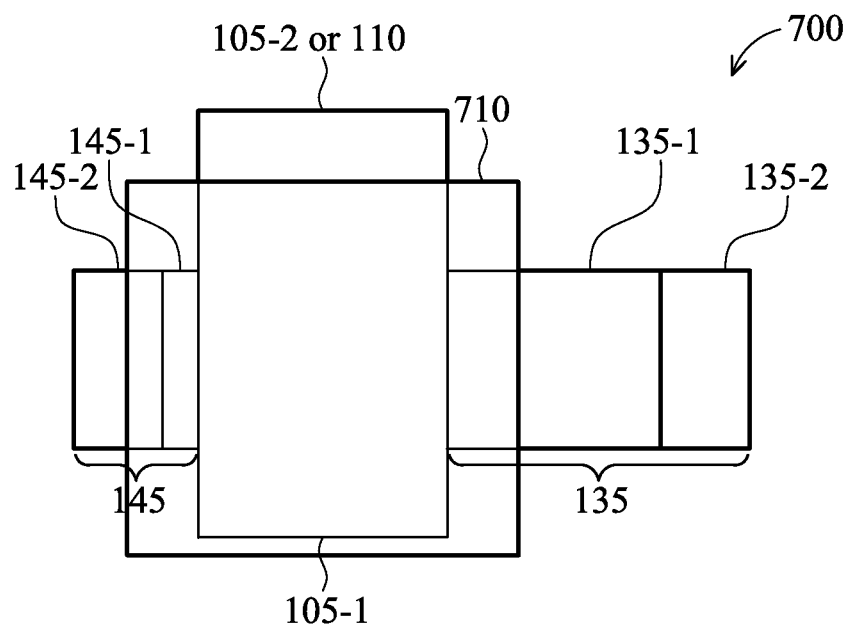
Figure 8A:
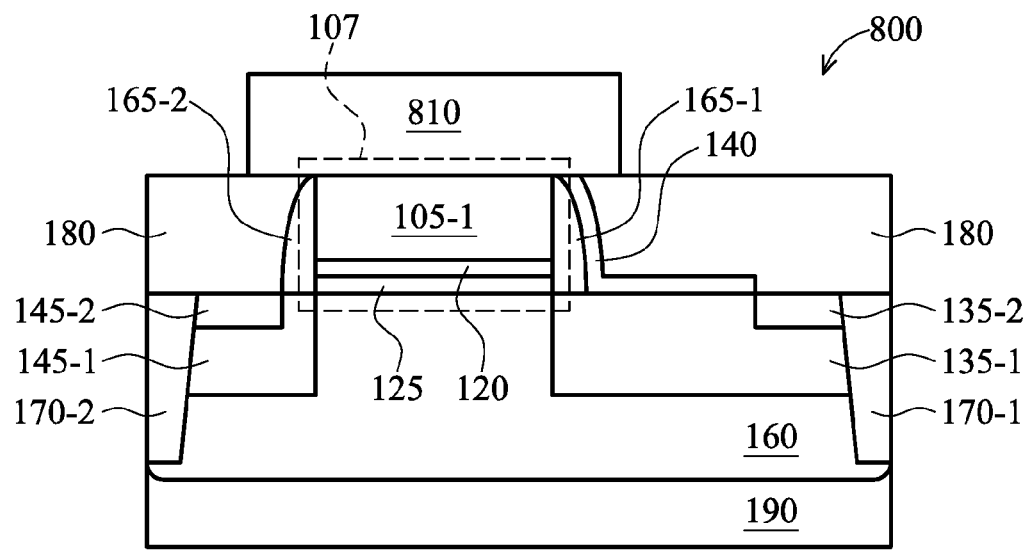
Figure 8B:
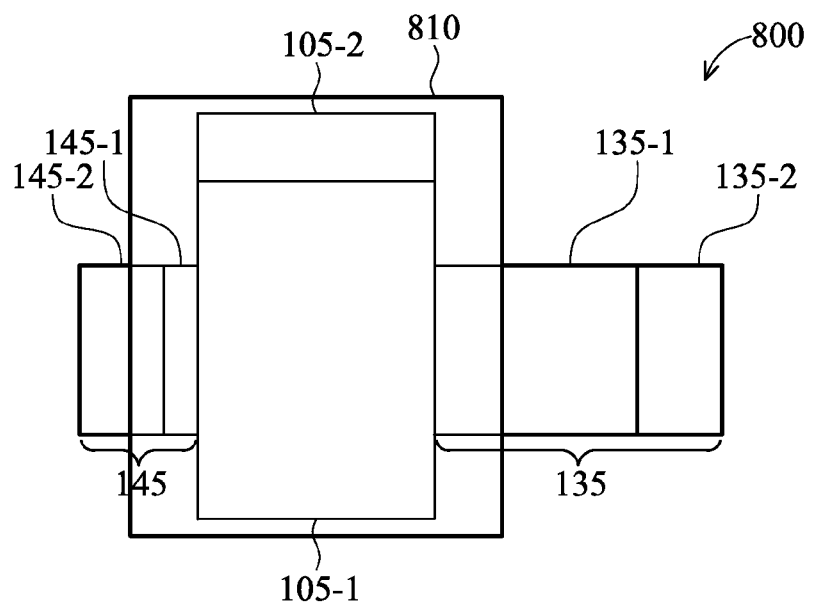

For simplicity, the top views of RPO layer 140 are not shown in FIGS. 6B, 7B and 8B. In structure 700 of FIGS. 7A and 7B, a photoresist layer 710 is patterned on top of portion 105-1 of poly gate layer 105 of gate stack 107. In other words, first portion 105-1 is covered by photoresist layer 710, and second portion 105-2 is not covered. Portion 105-1 is covered so that poly is not removed from portion 105-1. Portion 105-2 is not covered so that poly is removed from portion 105-2 and metal gate 110 is later formed. For illustration, reference numbers 105-2 and 110 are used interchangeably. In some embodiments, a dry etch process is used to remove poly from portion 105-2. In some embodiments, ESD device 100 is manufactured in parallel with a PFET device and an NFET device. Further, at this step, poly is removed from the poly gate of the PFET device while poly is not removed in a poly gate of the NFET device. As a result, in the illustration of a PFET ESD device 100, removing poly from portion 105-2 is also called a P-type poly removal. After the P-type poly removal, a P-metal gate deposition is performed on portion 105-2 to form metal gate layer 110. In effect, portion 105-2 of poly gate 105 is converted to metal layer 110. After metal layer 110 is formed, photoresist layer 710 is removed.

In structure 800 of FIGS. 8A and 8B, a photoresist layer 810 is patterned on top of poly gate layer 105, which covers both portion 105-1 and 105-2 of poly gate layer 105. In some embodiments, ESD device 100 is manufactured in parallel with both a PFET and an NFET device. As a result, at this step, poly of the poly gate of the NFET is removed. Photoresist layer 810 is used to protect poly gate layer 105 from the N-type poly removal or to protect poly in poly gate layer 105 from being removed.

Figure 9A:
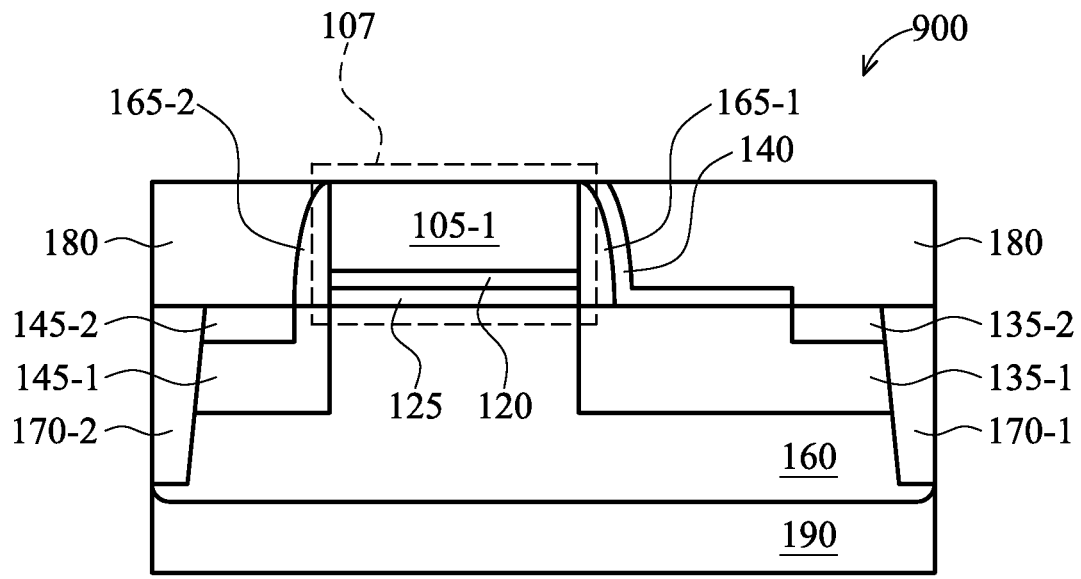
Figure 9B:
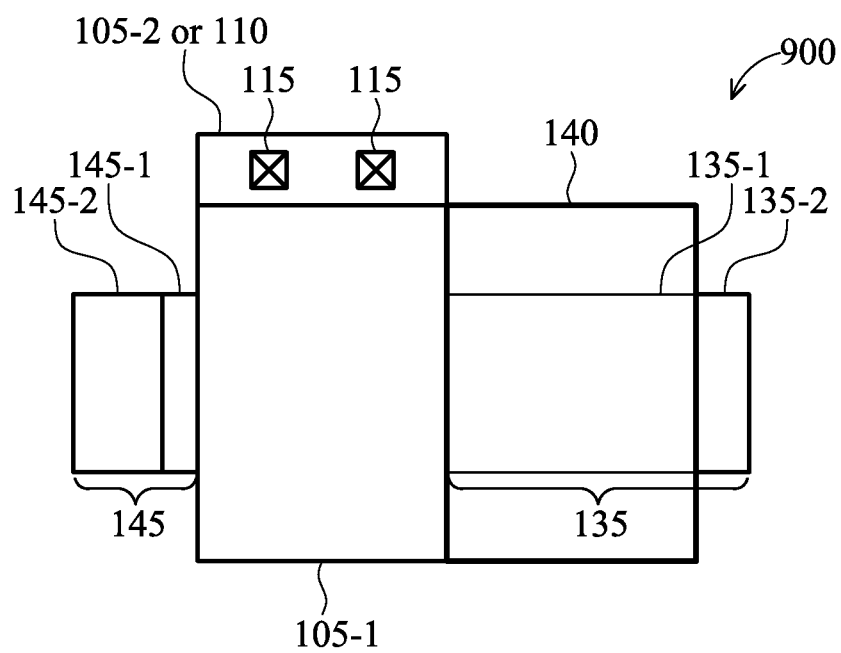

In structure 900 of FIGS. 9A and 9B, photoresist layer 810 is removed after the N-type poly removal. Contacts 115 are then formed in metal gate layer 110.

Those of ordinary skill in the art will recognize that ESD device 100 is formed by a gate-last process because gate stack 107 including poly gate layer 105, metal gate 120, and dielectric layer 125 is formed after drain 135 and source 145 are formed.

Various embodiments are advantageous because the resistance of gate stack 107 is high, no additional resistance/resistor is used outside of gate stack 107. As a result, die area for ESD device 100 is reduced, compared to other approaches. Consequently, the ESD protection is better. Additionally, the MOSCAP formed by metal layer 120, dielectric layer 125, and well 160 provides capacitance for use as appropriate.

The steps in FIGS. 4A to 9A and FIGS. 4B to 9B are illustrative examples of manufacturing ESD device 100. In various embodiments, elements of ESD device 200 and/or ESD device 300 are manufactured in the same manner and/or at the same time with the corresponding elements of ESD device 100. For example, layers 105D, 120D, and 125D are manufactured at the same time using the same techniques and/or materials as layers 105, 120, and 125, respectively. Drain 135-3, drain 135A, and drain 135B are manufactured at the same using the same material and/or technique used to manufacture drain 135. Spacers 165-3 and 165-4 are manufactured at the same time using the same material and/or technique to manufacture spacers 165-1 and 165-2, etc.

Variations

A gate stack 107 used in ESD device 100 is for illustration. The gate stack 107 used in various other devices is within the scope of various embodiments. Exemplary devices using such a gate stack include a metal-oxide-silicon capacitor (MOS capacitor or MOSCAP), an analog or radio frequency (RF) MOS, a high voltage MOS (HVMOS). An HVMOS refers to a MOS powered by a voltage higher than the operational voltage of other devices in the same circuitry. In a MOSCAP or analog/RF MOS, length LD is the same as length LS, and drain 135 and source 145 are symmetrical with respect to gate stack 107. Further, there is no RPO layer 140 shown in FIG. 1 that covers drain 135. To form a MOSCAP, drain 135, source 145, and bulk 190 are connected together and to ground while gate metal layer 120 is connected to the operational voltage. RF MOSFET are similar to ESD devices in which drain 145 and source 135 are asymmetrical, and drain 145 is electrically coupled to an IO of an integrated circuit. Further, the dimensions of an RF MOSMET are commonly larger than those of other devices.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments.

Some embodiments regard a device comprising a drain, a source, and a gate stack. The gate stack has a gate dielectric layer, a gate conductive layer immediately on top of the gate dielectric layer, and first gate and a second gate layer that are immediately on top of the gate conductive layer. The first gate layer has a first resistance higher than a second resistance of the second gate layer. The second gate layer is conductive, is electrically coupled with the gate conductive layer, and has a contact terminal configured to serve as a gate contact terminal for the device.

Some embodiments regard a method. In the method, a structure is used. The structure includes a drain region, a source region, and a gate stack that includes a gate dielectric layer, a gate conductive layer immediately on top of the gate dielectric layer, and a gate layer immediately on top of the gate conductive layer. A drain contact region in the drain and a source contact region in the source are formed. An interlayer dielectric is formed on top of the drain and the source, thereby on top of the drain contact region and the source contact region. A conductive region is formed in the gate layer. A gate contact terminal is formed in the conductive region of the gate layer.

Some embodiments regard a gate stack. The gate stack has a gate dielectric layer, a first gate metal layer immediately on top of the gate dielectric layer, and a poly gate layer and a second gate metal layer that are immediately on top of the first gate metal layer. The second gate metal layer includes a contact terminal.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A device comprising:
a gate stack between a first drain and a source, the gate stack having
a gate dielectric layer;
a gate conductive layer immediately on top of the gate dielectric layer; and
a first gate layer and a second gate layer, immediately on top of the gate conductive layer,
wherein
the first gate layer has a first resistance higher than a second resistance of the second gate layer; and
the second gate layer is conductive, is electrically coupled with the gate conductive layer, and has a contact terminal configured to serve as a gate contact terminal for the device.

2. The device of claim 1, wherein
the first drain includes a drain salicide portion and a drain non-salicide portion; and
the source includes a source salicide portion and a source non-salicide portion.

3. The device of claim 2, further comprising:
a first spacer on a first side of the gate stack;
a second spacer on a second side of the gate stack; and
a protection layer covering the first spacer and the drain non-salicide portion.

4. The device of claim 3, wherein the protection layer further covers at least a portion of the gate stack.

5. The device of claim 1, further comprising:
a second gate stack; and
a second drain,
wherein
the second drain is in between the gate stack and the second gate stack; and
the second gate stack is in between the second drain and the first drain.

6. The device of claim 5, further comprising
a first spacer on a first side of the gate stack;

a second spacer on a second side of the gate stack;
a third spacer on a first side of the second gate stack;
a fourth spacer on a second side of the second gate stack; and
a protection layer covering the first spacer, a portion of the second drain, and the fourth spacer.

7. The device of claim 6, wherein
the second gate stack includes a
a second gate dielectric layer;
a second gate conductive layer immediately on top of the second dielectric layer; and
a third gate layer immediately on top of the second gate conductive layer;
the first drain includes a drain salicide portion and a drain non-salicide portion;
the source includes a source salicide portion and a source non-salicide portion; and
the second drain is not salicided.

8. The device of claim 1, further comprising
a first shallow trench isolation;
a second shallow trench isolation; and
a third shallow trench isolation,
wherein
the source and the gate stack are in between the second shallow trench isolation and the third shallow trench isolation;
the second shallow trench isolation is in between the gate stack and the first drain; and
the first drain is in between the second shallow trench isolation and the first shallow trench isolation.

9. The device of claim 8, wherein
the first drain includes a salicide layer and non-salicide layer; and
the salicide layer of the first drain completely covers the non-salicide layer of the first drain.

10. The device of claim 8, further comprising:
a first well containing the source; and
a second well containing the first drain.

11. The device of claim 10, wherein
a first well dopant type of the first well is different from a drain-source dopant type of the first drain and of the source; and
a second well dopant type of the second well is the same as the drain-source dopant type of the first drain and of the source.

12. The device of claim 1, further comprising a well containing the source and the first drain.

13. The device of claim 1, wherein the first drain is electrically coupled to an IO of an integrated circuit.

14. The device of claim 1, wherein the first drain, the source, and a bulk are coupled together and are configured to receive to a reference voltage, and the gate stack is configured to receive an operational voltage.

15. A gate stack comprising:
a gate dielectric layer;
a first gate metal layer immediately on top of the gate dielectric layer; and
a poly gate layer and a second gate metal layer, immediately on top of the first gate metal layer; the second gate metal layer including a contact terminal.

16. The gate stack of claim 15, wherein an effective resistance of the first gate metal layer is less than that of the poly gate layer.

17. The gate stack of claim 15, wherein the first gate metal layer comprises titanium nitride.

18. The gate stack of claim 15, wherein the gate stack is free from having a silicide region immediate on the poly gate layer.

19. A device comprising:
a well region comprising a well of a first dopant type;
a drain of a second dopant type in the well region;
a source of the second dopant type in the well region;
a gate stack over a portion of the well, the portion of the well being between the drain and the source, the gate stack comprising:
a gate dielectric layer;
a first gate conductive layer immediately on top of the gate dielectric layer;
a second gate conductive layer immediately on top of a first portion of the first gate conductive layer; and
a third gate conductive layer immediately on top of a second portion of the first gate conductive layer,
the second gate conductive layer having greater conductivity than the third gate conductive layer.

20. The device of claim 19, further comprising:
a contact terminal in contact with the second gate conductive layer.

21. The device of claim 19, further comprising:
a first spacer on a first side of the gate stack;
a second spacer on a second side of the gate stack; and
a protection layer covering the first spacer and a portion of the drain.

22. The device of claim 21, wherein the portion of the drain is a non-salicide portion of the drain.

23. The device of claim 21, wherein the protection layer further covers at least a portion of the gate stack.

* * * * *